United States Patent
Holloway (12)

(10) Patent No.: US 6,222,251 B1
(45) Date of Patent: *Apr. 24, 2001

(54) VARIABLE THRESHOLD VOLTAGE GATE ELECTRODE FOR HIGHER PERFORMANCE MOSFETS

(75) Inventor: Thomas C. Holloway, Murphy, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,655
(22) Filed: Mar. 4, 1999

Related U.S. Application Data

(62) Division of application No. 09/014,071, filed on Jan. 27, 1998, now abandoned
(60) Provisional application No. 60/034,852, filed on Jan. 27, 1997.

(51) Int. Cl.[7] .......................... H01L 29/167; H01L 29/76; H01L 29/94
(52) U.S. Cl. ..................... 257/607; 257/345; 257/385
(58) Field of Search ........................... 257/345, 314, 257/335, 385, 391, 392, 405, 404, 407, 413, 548, 550, 607, 412, 756; 438/647, 657, 585, 587, 588, 592

(56) References Cited

U.S. PATENT DOCUMENTS

| 4,990,974 | * | 2/1991 | Vinal ...................................... 257/408 |
| 5,371,396 | * | 12/1994 | Vinal et al. ........................... 257/412 |
| 5,514,902 | * | 5/1996 | Kawasaki et al. .................... 257/607 |

* cited by examiner

Primary Examiner—Tom Thomas
Assistant Examiner—Hung Kim Vu
(74) Attorney, Agent, or Firm—Jacqueline J. Garner; Wade James Brady, III; Frederick J. Telecky, Jr.

(57) ABSTRACT

A transistor is formed on the substrate (10) with a graded doping profile for the gate electrode (22). This graded profile is performed for an N-channel transistor by depositing the gate electrode with two separate layers of material. The first layer is a thin layer of N-doped poly, whereas the second layer is a layer of P-doped poly (18). A layer of cap oxide (20) is disposed over the gate electrode (22) to prevent further implantation of impurities during the source/drain implant operation.

1 Claim, 3 Drawing Sheets

VARIABLE THRESHOLD VOLTAGE GATE ELECTRODE FOR HIGHER PERFORMANCE MOSFETS

CROSS REFERENCE TO PRIOR APPLICATIONS

This application is a division of Ser. No. 09/014,071, filed Jan. 27, 1998, abandoned, which claims priority based upon Provisional Application Serial No. 60/034,852 filed Jan. 27, 1997.

TECHNICAL FIELD OF THE INVENTION

The present invention pertains in general to silicon gate CMOS technology and, more particularly, to the fabrication of the silicon gate electrode and the doping profile across the gate electrode from the upper surface to the gate oxide boundary.

BACKGROUND OF THE INVENTION

With the advent of polycrystalline silicon technology, the MOS transistor comprised of a layer of polysilicon disposed over a channel region and separated therefrom by a gate oxide has been a mainstay for the fabrication process of MOS transistors. In the early days of this technology, a conformal layer of polysilicon was first disposed over the substrate and then patterned to form the gate electrodes of the MOS transistors within the various active regions. Thereafter, this gate electrode was utilized as the mask to define the channel regions, wherein an implant step was operable to form source/drain regions on either side of the channel. This was acceptable for early integrated circuits, as the size of the transistors was quite large. However, as device sizes have been scaled down with the advent of new technology, the gate electrodes have become much narrower and thinner, this in and of itself presenting some difficulties and challenges to the designer.

The quality of a transistor is affected by the doping level in the polysilicon. Typically, the conductivity of the polysilicon is increased as much as possible and, therefore, it is heavily doped. In early CMOS devices, the polysilicon that was utilized to form the gate electrode was typically subjected- to a uniform doping of one impurity type, such as N-type impurities. For N-channel transistors, this resulted in the formation of an acceptable transistor. This was due to the fact that the majority carrier in the gate was opposite to the majority carrier in the channel region. In the P-channel device, the opposite condition was present. Typically, a threshold adjust implant was required in the P-channel transistor. As transistor technology advanced, the gate electrodes for P-channel transistors were doped separately from those for N-channel transistors, such that P-type impurities were introduced into the gate electrodes associated with P-channel transistors.

Typically, the doping level in the gate electrode is relatively high. This is for the purpose of minimizing the voltage dependency of the gate oxide thickness. For low doping levels in the gate electrode, a high voltage associated with a transistor that is turned on will result in a depletion region forming in the gate electrode adjacent to the gate oxide boundary. This will increase the effective gate oxide thickness. This can be detrimental to frequency response and other parameters of the transistor. By increasing the doping level, this depletion region is minimized, as majority carriers adjacent to the gate/oxide boundary are depleted. Of course, in some situations, such as that for high voltage transistors, it is desirable to have the gate oxide thickness increase with voltage. This, of course, is not true for small signal transistors.

SUMMARY OF THE INVENTION

The present invention disclosed and claimed herein comprises a method for forming a gate electrode for an MOS transistor. The MOS transistor is formed in a substrate of a first conductivity type with a gate electrode provided overlying the channel region of the transistor and separated therefrom by a layer of gate oxide. The gate electrode is formed such that it has a graded doping profile with a concentration of first conductivity type dopants therein that have a relatively high concentration at the upper surface thereof, which concentration decreases from the upper surface of the gate electrode to a point proximate to the gate oxide layer.

In another aspect of the present invention, the graded doping profile of the first conductivity type dopants decreases from a relatively high concentration at the upper surface of the gate electrode to a lower concentration at a point proximate to but spaced away from the gate oxide layer. This allows a region of conductive material disposed proximate to the gate oxide layer that has a minimal concentration of first conductivity type dopants therein. The region with minimal first conductivity dopants therein is lightly doped with second conductivity type dopants.

In a further aspect of the present invention, the gate electrode is formed by first forming a layer of polysilicon over the gate oxide layer in the transistor active region, which first layer of polysilicon is doped with second conductivity type dopants in a light concentration during the deposition of the first layer. Thereafter, a second layer of polysilicon is deposited onto the substrate having a light concentration of first conductivity type dopants therein. This concentration of dopants in the second layer of polysilicon is higher than the concentration of the dopants of the second type conductivity in the first layer.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
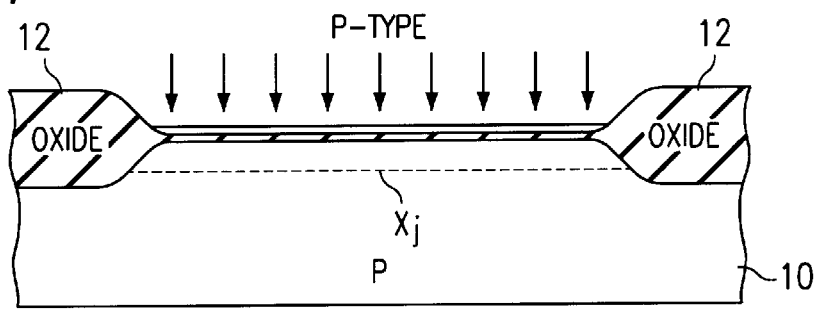
FIG. 1 illustrates a cross-sectional diagram of a substrate in the initial step of the process for forming a channel implant in an active region.

Referring now to FIG. 1, there is illustrated a cross-sectional diagram of a P-type substrate for forming an N-channel transistor therein. The substrate 10 is first processed to form active regions therein. To form the active regions, a nitride layer is formed over the substrate and then patterned to define isolation regions therein, i.e., regions that lie outside of the active regions in which transistors are to be formed and which separate the active regions from each other. Once patterned, the substrate is then subjected to an oxidation procedure, such as a conventional LOCOs process or some type of trench isolation, these being conventional techniques. This provides a field oxide region 12 about the active region, of which only one active region is illustrated in the present invention. Thereafter, the nitride mask (not shown) is removed followed by the formation of a pad oxide over the surface of the active region. At this point, an implant is performed to form the punch-through implant. The punch-through implant is an implant that is formed beneath the channel region to reduce the width of the depletion region at the source/drain regions on the lower surface thereof below the channel region. This is conventional. The implant for the punch-through in the present invention is performed utilizing boron that is implanted at a dosage of $4E12/cm^2$ at a power level of 60 keV. This is for an N-channel transistor. For a P-channel transistor, the impurities would be phosphorous and they would be implanted at a dosage level of $7e13/cm^2$ at an energy of 130 keV. This is to be compared with a conventional technique which would require both a threshold implant close to the surface in the channel region and a punch-through implant. The implant procedure for a conventional N-channel transistor would be boron impurities at a dosage of $6E12/cm^2$ at an energy of 20 keV for a threshold implant, followed by a punch-through implant of boron at a dosage of $4E12/cm^2$ at an energy level of 60 keV. For a P-channel transistor in a conventional operation, the threshold voltage would be phosphorous at a dosage of $1E13cm^2$ at an energy level of 50 keV, with the punch-through implant being phosphorous at a dosage of $7E13/cm^2$ at an energy level of 130 keV. Although the present example does not utilize a threshold implant, such an implant could be utilized, as will be described hereinbelow. The punch-through implant will result in a defined junction X, which represents the point at which the impurities return to the level of the substrate impurities.

Figure 2:
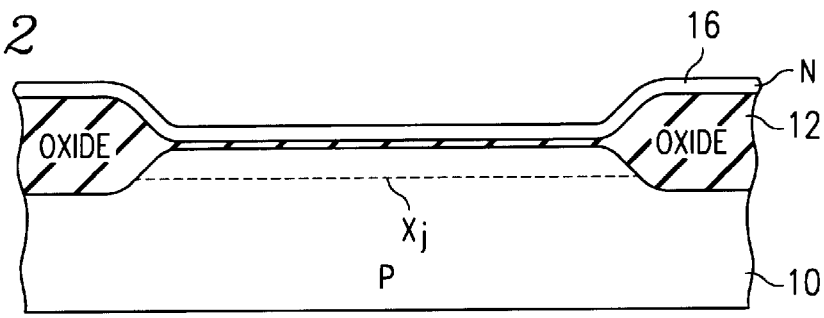
FIG. 2 illustrates a cross-sectional diagram of the substrate after formation of the gate oxide layer and the first doped layer of an N-type poly.

Referring now to FIG. 2, there is illustrated the next step of the process. In this step, a layer of gate oxide is first formed over the top surface of the active region to a thickness of 20–100 Angstroms followed by the deposition of a thin layer 16 of doped polysilicon onto the substrate by an LPCVD operation. The doping operation is done in an atmosphere of arsenic, such that, for an N-channel transistor, the thin layer 16 would have a concentration of $4E18/cm^3$. For the P-channel transistor, the layer 16 would have a thickness of 300 Angstroms at a concentration of $7E18/cm^3$ of boron.

Figure 3:
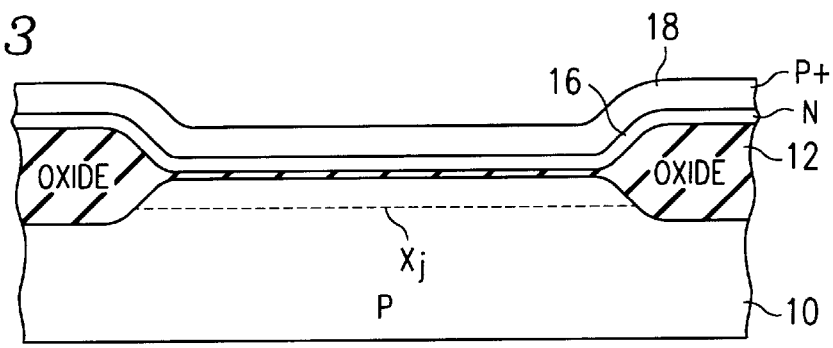
FIG. 3 illustrates a cross-sectional diagram of the substrate in the next step of the process wherein a thicker layer of P-doped poly is deposited over the substrate.

Referring now to FIG. 3, there is illustrated the next step in the process, wherein a thick layer 18 of doped polysilicon is deposited over the substrate on top of the thin layer 16. The layer 18 for the N-channel transistor is deposited to a thickness of 2,300 Angstroms with a doping concentration of boron of $1E19/cm^3$. For a P-channel transistor, the thickness of the layer 18 would be 2,200 Angstroms with a doping level of $1E19cm^3$ of arsenic. Again, the doping is performed during the deposition process, which deposition process is an LPCVD deposition process.

The deposition of the two layers 16 and 18 is to be compared with a conventional process. In a conventional process, the doped poly would have a thickness of 2,500 Angstroms. For an N-channel transistor, this would be an N-type material with a concentration of $1E20/cm^3$ of phosphorous. A conventional P-channel transistor would have a doping level of $1E19/cm^3$ of boron, for a P-channel transistor. Therefore, it can be seen that the N-channel transistor in the process of the present invention has a lightly doped N-type layer proximate to the gate oxide layer with a thicker overlying layer of P-type material that is more heavily doped. For the P-channel transistor, a lightly doped P-type layer is disposed proximate to the gate oxide layer, with a thicker overlying layer of N-type material.

Figure 4:
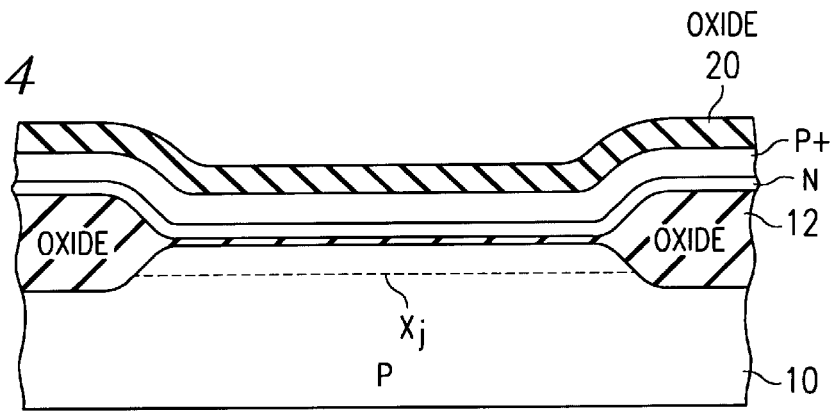
FIG. 4 illustrates a cross-sectional diagram of the substrate in the next step of the process wherein a cap oxide layer is deposited.

Referring now to FIG. 4, there is illustrated a cross-sectional diagram of the next step of the process. In this step, a layer of cap oxide 20 is disposed over the layer 18 of P-type poly, this oxide layer 20 having a thickness of approximately 1,000 Angstroms and being a conformal layer. As will be described hereinbelow, this layer is utilized as a "cap oxide".

Figure 5:
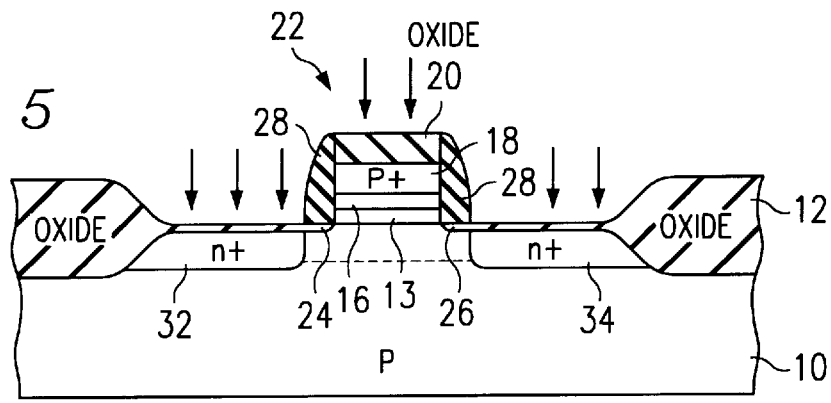
FIG. 5 illustrates a cross-sectional diagram of a completed transistor.

Referring now to FIG. 5, the finishing steps for forming the transistor will be described. The substrate is patterned and etched to form a gate electrode 22. The gate electrode 22 consists of the gate oxide layer 13, the thin N-type doped poly layer 16, the thicker P+ doped poly layer 18 and the cap oxide layer 20. At this point, the substrate is subjected to a lightly doped drain (LDD) implant to form LDD regions 24 and 26 on either side of the gate electrode 22. The substrate then has a layer of oxide deposited thereover and then is subjected to an anisotropic etch process to remove the portion of the oxide layer on substantially horizontal surfaces. This will result in sidewall oxide layers 28 formed on either side of the gate. electrode 30. These sidewall oxide layers 28 are spacer layers that are utilized to extend the edge of the electrode 22 outward from the channel. Thereafter, the substrate is subjected to an implant operation of N+ impurities. This implant step results in a concentration on the order of $10e21/cm^3$, resulting in an N+ source/drain region 32 formed under the LDD region 24 and an N+ source/drain region 34 formed under the LDD region 26, the source/drain regions 32 and 34 spaced away from the edge of the gate electrode 22 by the sidewall oxide layers 28. The LDD regions 24 and 26 are operable to extend the source/drain regions 32 and 34 into the channel.

After formation of the LDD regions 24 and 26 and the source/drain regions 32 and 34, the substrate is subjected to an anneal operation such that the LDD regions 24 and 26 and the source/drain regions 32 and 34 will be extended downward into the substrate, this being a conventional operation. It is noted that the oxide cap layer 20 prevents the impurities that are implanted into the source/drain regions 32 and 34 from being implanted into the P+ layer 18 and therefore increasing the concentration therein.

Figure 6:
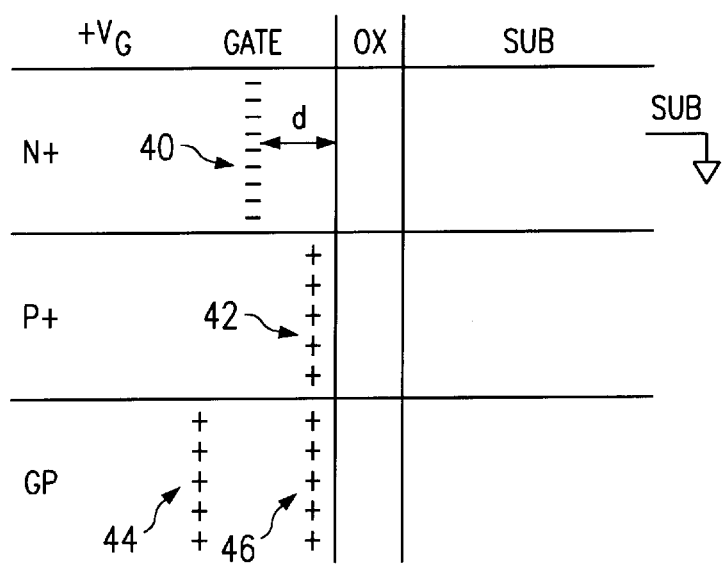
FIG. 6 illustrates a diagrammatic plot of the carrier concentrations for a positive gate voltage.

Referring now to FIG. 6, there is illustrated a diagram of the depletion region formed in the gate electrode 22 for different doping concentrations illustrating a conventional N+ doping level for an N-channel transistor, a P+ doping level for an. N-channel transistor and a graded P-doped region in accordance with the present invention. This diagram of FIG. 6 is illustrated for a positive voltage on the gate electrode 22.

For the situation where the impurities are N+, the conventional configuration, it can be seen that a positive voltage will cause an accumulation of majority carriers (electrons) 40 proximate to the oxide boundary and spaced therefrom by a distance "d". This distance d is the depletion region which results from a positive voltage applied to an N+ material. The width of this depletion region is a function of the doping level of the gate electrode with N-type material and can vary. As a result, however, the thickness of the gate oxide is effectively increased.

For the second case, where the entire electrode is doped with P+ material, a positive voltage will cause an accumulation of majority carriers (holes) 42 proximate to the gate oxide boundary. This is an accumulation. As such, the effective gate oxide will not be increased. However, one disadvantage to this configuration is that some type of threshold adjust implant will be required, as compared to the situation for the N+ doped gate.

In the preferred embodiment, that for the graded P-type doping profile labeled "GP", the source of majority carriers (holes) is disposed a predetermined distance away from the gate oxide boundary, as represented by holes 44. When the positive voltage is applied, the holes will migrate to the gate oxide boundary and result in an accumulation of holes 46 at the gate oxide boundary.

Figure 7:
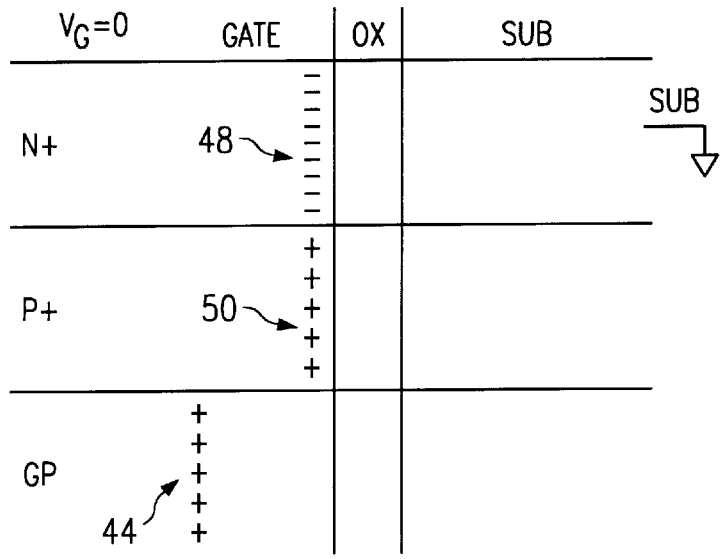
FIG. 7 illustrates the plot of FIG. 6 with the gate voltage tied to ground.

Referring now to FIG. 7, there is illustrated the diagram of FIG. 6 with the exception that the gate voltage is now set to a zero voltage. For the condition where the gate electrode is doped entirely of N+ material, there will be a depletion of majority carriers (electrons) 48 disposed a small distance from the gate oxide boundary. With respect to the gate electrode being doped completely with the P+ material, there will be an accumulation of holes 50 proximate to the gate oxide boundary and disposed apart therefrom. Both the condition with a completely N+ doped gate electrode and with a P+ doped gate electrode result in a slight depletion layer at the gate oxide boundary for a "0". This will increase the capacitance of the oxide layer. By comparison, the graded P+ material gate electrode will have no depletion region, as there is no depletion of minority carriers from the substrate proximate to the oxide. The threshold voltage of the transistor is proportional to the bulk charged divided by the oxide capacitance, and, therefore, when the oxide capacitance decreases, the threshold voltage will rise. When the voltage is near zero, the N+ region will have the largest oxide capacitance, such that the $V_T$ will go down. Similarly, the P+ region at a zero voltage will have an increase in the oxide capacitance due to the holes not accumulating at the surface, such that the threshold voltage will go down as the voltage approaches zero. Compare this to the graded P+ gate electrode wherein the oxide capacitance actually goes down, relatively speaking, such that the threshold voltage will increase. Therefore, the higher $V_T$ at the zero voltage will be the result. It can therefore be seen that a transistor that has an increasing threshold voltage as the gate voltage decreases will have a harder "turn off" condition. Therefore, for a voltage swing from an on to an off condition for a transistor, the graded P+ gate electrode will provide some advantage.

Figure 8:
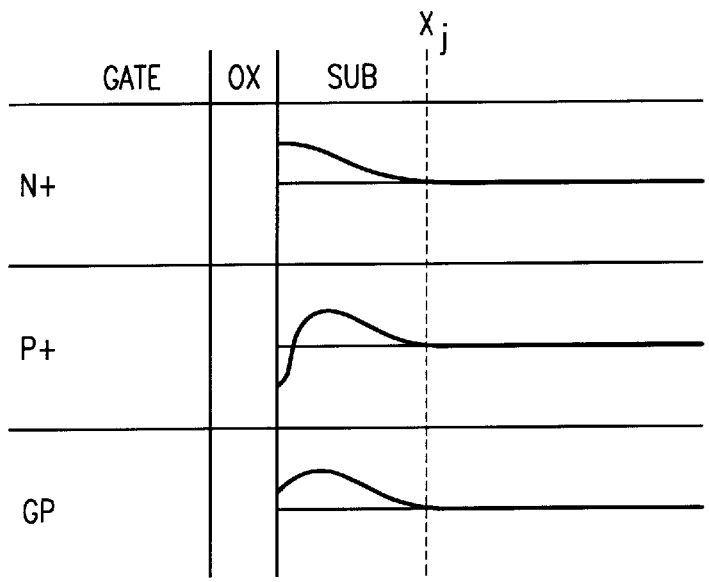
FIG. 8 illustrates a graphic view of the substrate doping for the three types of gate doping profiles.

Referring now to FIG. 8, there is illustrated a diagrammatic view of channel doping profiles for the three conditions, an N+ doped gate electrode, P+ doped gate electrode, and a graded P+ doped gate electrode. For the N+ doped gate electrode, it can be seen that the level of impurities is raised in the channel to a level of approximately $6e17/cm^3$. This is the result of both the threshold implant and the punch-through implant. With respect to an entirely P+ doped gate electrode, the punch-through implant will result in an increase in the P-type impurity level, which is followed by a doping at the oxide boundary in the channel of N-type impurities. This is a buried channel configuration. The graded P+ electrode will have the area underlying the channel region doped slightly for the purpose of the punch-through. However, it should be noted that threshold voltages can be adjusted in any of the three configurations, including the graded P+ electrode of the present invention, for the purpose of adjusting the threshold. Although it is desirable to eliminate any threshold implants, these may be needed.

Figure 9:
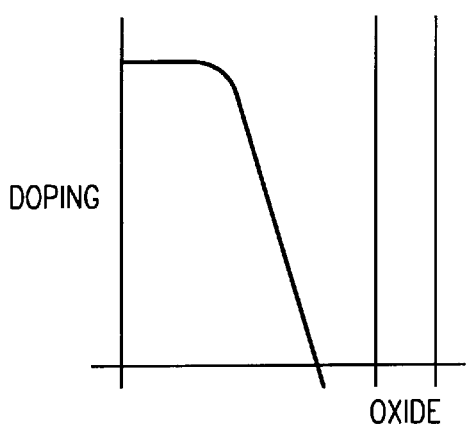
FIG. 9 illustrates a doping profile for the gate electrode utilizing only a P+ dopant.
Figure 10:
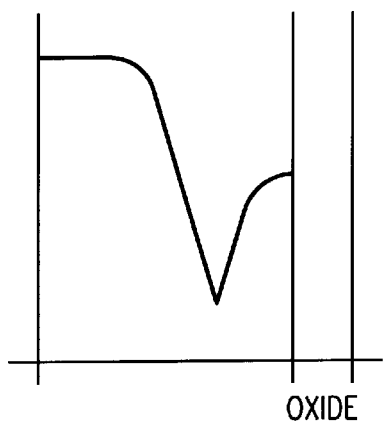
FIG. 10 illustrates a doping profile for the gate electrode with two doped layers.

Referring now to FIG. 9, there is illustrated a doping profile, which illustrates only the doping of the P+ impurities in the upper portion of the gate electrode, this being slightly different than that described hereinabove. In this embodiment, the P+ impurities would be provided in the upper layer by either utilizing a two-layer technique as described above or by merely doping gate electrode at the surface and then annealing it such that the impurities are driven down to within approximately 100 Angstroms of the gate oxide layer. As such, the lower 100 Angstroms of the gate electrode proximate the oxide would have virtually no doping other than the intrinsic doping level of the poly. In FIG. 10, there is illustrated a doping profile of the preferred embodiment, wherein P-type dopants are provided in one layer and N-type dopants are provided in the other layer, the N-type dopant concentration being at a very low concentration level.

A simulation was performed on the overall process flow for the above noted dopant concentrations for both the conventional and the preferred embodiment. The results of that simulation performed on a Suprem3 simulation with a 40 Angstrom gate oxide are as follows:

|  | CONVENTIONAL | | PREFERRED EMBODIMENT | |
| --- | --- | --- | --- | --- |
|  | N-CHANNEL | P-CHANNEL | N-CHANNEL | P-CHANNEL |
| Vt | 0.55 V | −0.45 V | 0.58 V | −0.47 V |
| Ch Conductance Vg = 1.8 V 1/(ohm/sq) | 1.7e−4 | 5.0e−5 | 2.9e−4 | 1.4e−4 |

In summary, there has been provided a method for fabricating a gate electrode of an MOS transistor. The method includes doping the gate electrode with impurities of the type in the channel region. This doping is graded, such that the impurity level at the upper surface is disposed away from the gate oxide layer is doped heavily and the doping falls off rapidly just prior to the portion adjacent the gate electrode.

Although the preferred embodiment has been described in detail, it should be understood that various changes, substitutions and alterations can be made therein without departing from the spirit and scope of the invention as defined by the appended claims.

What is claimed is:

1. An MOS transistor comprising:

a semiconductor substrate of first conductivity type having a pair of spaced apart source/drain regions of opposite conductivity type and a channel region extending between said source/drain regions;

a gate electrode of said first conductivity type having an upper surface and an opposed lower surface, said lower surface disposed over said channel region and separated from said channel region by a gate oxide layer which contacts said lower surface of said gate electrode;

the gate electrode having a doping profile that comprises a relatively heavy concentration of dopant of said first conductivity type proximate said upper surface of said gate electrode, the concentration of said first conductivity type dopant having a profile that decreases from said upper surface of said gate electrode to a level adjacent said lower surface and spaced from said lower surface to provide a region between said first conductivity type doped region in said gate electrode having a profile that decreases from said upper surface of said gate and said gate oxide layer which has a minimal concentration of said first conductivity type dopant;

wherein the region between the gate oxide layer and the region having a profile that decreases from said upper surface of said gate is lightly doped with dopant of second conductivity type.

* * * * *